(12) United States Patent
Yamamoto et al.

(10) Patent No.: US 10,714,664 B2
(45) Date of Patent: *Jul. 14, 2020

(54) LIGHT EMITTING DEVICE

(71) Applicant: NICHIA CORPORATION, Anan-shi, Tokushima (JP)

(72) Inventors: Atsushi Yamamoto, Komatsushima (JP); Kenji Kawano, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/521,545

(22) Filed: Jul. 24, 2019

(65) Prior Publication Data

US 2019/0348580 A1 Nov. 14, 2019

Related U.S. Application Data

(63) Continuation of application No. 14/876,237, filed on Oct. 6, 2015, now Pat. No. 10,490,711.

(30) Foreign Application Priority Data

Oct. 7, 2014 (JP) .................................. 2014-206066
Oct. 2, 2015 (JP) .................................. 2015-196955

(51) Int. Cl.
*H01L 33/54* (2010.01)
*H01L 33/50* (2010.01)
(Continued)

(52) U.S. Cl.
CPC ............ *H01L 33/54* (2013.01); *C09K 11/616* (2013.01); *C09K 11/665* (2013.01); *G02B 6/005* (2013.01);
(Continued)

(58) Field of Classification Search
CPC .. C09K 11/616; C09K 11/665; G02B 6/0023; G02B 6/005; G02B 6/0073;
(Continued)

(56) References Cited

U.S. PATENT DOCUMENTS

2005/0184638 A1 8/2005 Mueller et al.
2006/0038187 A1 2/2006 Ueno
(Continued)

FOREIGN PATENT DOCUMENTS

JP 2005-244226 A 9/2005
JP 2006-049735 A 2/2006
(Continued)

OTHER PUBLICATIONS

Final Office Action on U.S. Appl. No. 14/876,237 dated Feb. 27, 2019.
(Continued)

*Primary Examiner* — Bijan Ahvazi
(74) *Attorney, Agent, or Firm* — Foley & Lardner LLP

(57) ABSTRACT

A device includes a light emitting device including: a light emitting element adapted to emit a blue light, a sealing resin covering the light emitting element, and a sulfide phosphor-containing layer disposed separate from the sealing resin; and a diffusion plate disposed between the sealing resin and the sulfide phosphor-containing layer, the diffusion plate being spaced apart from the sealing resin.

20 Claims, 7 Drawing Sheets

(51) Int. Cl.
*H05B 33/14* (2006.01)
*F21V 8/00* (2006.01)
*C09K 11/61* (2006.01)
*C09K 11/66* (2006.01)
*G02F 1/1335* (2006.01)
*G02F 1/13357* (2006.01)

(52) U.S. Cl.
CPC ..... *G02B 6/0073* (2013.01); *G02F 1/133603* (2013.01); *H01L 33/502* (2013.01); *H01L 33/504* (2013.01); *H01L 33/507* (2013.01); *H05B 33/14* (2013.01); *G02B 6/0023* (2013.01); *G02F 2001/133614* (2013.01); *G02F 2001/133624* (2013.01)

(58) Field of Classification Search
CPC ... G02F 1/133603; G02F 2001/133614; G02F 2001/133624; H01L 33/54; H01L 33/502; H01L 33/504; H01L 33/507; H05B 33/14
See application file for complete search history.

(56) References Cited

U.S. PATENT DOCUMENTS

| | | |
|---|---|---|
| 2007/0057626 A1 | 3/2007 | Kurihara et al. |
| 2008/0180948 A1 | 7/2008 | Yoon et al. |
| 2010/0142189 A1 | 6/2010 | Hong et al. |
| 2014/0256205 A1 | 9/2014 | Cordingley |
| 2015/0197689 A1 | 7/2015 | Tani et al. |
| 2016/0087164 A1 | 3/2016 | Kawano et al. |

FOREIGN PATENT DOCUMENTS

| | | |
|---|---|---|
| JP | 2007-243135 A | 9/2007 |
| JP | 2008-041550 A | 2/2008 |
| JP | 2008-166825 A | 7/2008 |
| JP | 2009-212508 A | 9/2009 |
| JP | 2009-231273 A | 10/2009 |
| JP | 2010-045328 A | 2/2010 |
| JP | 2013-232484 A | 11/2013 |
| JP | 2014-024918 A | 2/2014 |
| JP | 2014-060328 A | 4/2014 |
| WO | WO-2007/002234 A1 | 1/2007 |

OTHER PUBLICATIONS

Non-Final Office Action on U.S. Appl. No. 14/876,237 dated Oct. 9, 2018.

U.S. Office Action on U.S. Appl. No. 14/876,237 dated Jul. 6, 2017.

U.S. Office Action on U.S. Appl. No. 14/876,237 dated Jan. 29, 2018.

LIGHT EMITTING DEVICE

CROSS-REFERENCE TO RELATED APPLICATIONS

This application is a continuation of U.S. patent application Ser. No. 14/876,237, filed on Oct. 6, 2015, which claims priority to Japanese Patent Application No. 2014-206066, filed on Oct. 7, 2014, and Japanese Patent Application No. 2015-196955, filed on Oct. 2, 2015, the disclosures of which are hereby incorporated by reference in their entireties.

BACKGROUND

1. Technical Field

The present disclosure relates to light emitting devices, and more particularly to a light emitting device that includes a light emitting element configured to emit a blue light, and a sulfide phosphor configured to emit a green light upon absorbing a portion of the blue light emitted from the light emitting element.

2. Description of the Related Art

There have been known light emitting devices adapted to emit a white light. This kind of light emitting device includes a light emitting element to emit a blue light, a green phosphor to emit a green light (or a yellow-green phosphor to emit a yellow-green light) upon absorbing a portion of the blue light emitted from the light emitting element, and a red phosphor to emit a red light upon absorbing a portion of the blue light emitted from the light emitting element. Such light emitting devices adapted to emit a white light are used in various applications, such as illumination devices and backlights for various displays, such as liquid crystal displays.

In recent years, light emitting devices having all or a portion of such phosphors replaced by a sulfide phosphor have been developed. For example, JP 2014-024918 A discloses a white light emitting device that includes a green sulfide phosphor and a red phosphor.

Green sulfide phosphors have high light emitting efficiency and a narrower full width at half maximum of the emission spectrum compared to that of a β-sialon phosphor that is commonly used as a green phosphor. Thus, the light emitting device using a sulfide phosphor has an advantage of a wide color reproducibility range when combined with a color filter of a liquid crystal display or the like. Further, matching the peak wavelength of the color filter (a wavelength at which its transmittance reaches a peak) to the emission peak of the sulfide phosphor allows for more light to pass through the color filter, which improves the light extraction efficiency with less attenuation of the light in use of the color filter. Particularly, the green sulfide phosphors have higher light emitting efficiency than that of conventional green phosphors, allowing for liquid crystal panels of high brightness.

However, these conventional light emitting devices employing such a sulfide phosphor are designed to use a phosphor such as CaS:Eu, $(BaSr)_3SiO_5$:Eu, or the like, as the red phosphor, which may lead to the occurrence of secondary absorption. That is, a portion of the green light (or the yellow-green light) emitted from the green sulfide phosphor that has absorbed the blue light is absorbed by the red phosphor which then emits a red light. The occurrence of such secondary absorption leads to a reduction in the luminous efficiency of the whole light emitting device. On the other hand, in many applications such as in displays and illumination devices, there has arisen a need for a light emitting device that can emit brighter light with lower power consumption, that is, which has high luminance efficiency.

SUMMARY

Certain embodiments of the present invention have been made to meet the foregoing requirements, and it is an object of certain embodiments of the present invention to provide a light emitting device that achieves high luminous efficiency while utilizing a green sulfide phosphor.

According to one embodiment of the present invention, a light emitting device includes a light emitting element adapted to emit a blue light, a sealing resin covering the light emitting element, and a sulfide phosphor-containing layer disposed at an outer side of the sealing resin. The sealing resin includes at least one of a KSF phosphor or a MGF phosphor. The KSF phosphor is a compound having the chemical formula $A_2[M_{1-a}Mn^{4+}_aF_6]$ (1), where A is at least one selected from the group consisting of $K^+$, $Li^+$, $Na^+$, $Rb^+$, $Cs^+$ and $NH^{4+}$, M is at least one element selected from the group consisting of Group 4 elements and Group 14 elements, and $0<a<0.2$; and the KSF phosphor is adapted to absorb at least a portion of the blue light emitted from the light emitting element to emit red light. The MGF phosphor is a compound having the chemical formula $(x-a)MgO \cdot (a/2)Sc_2O_3 \cdot yMgF_2 \cdot cCaF_2 \cdot (1-b)GeO_2 \cdot (b/2)Mt_2O_3 : zMn^{4+}$ (2), where $2.0 \le x \le 4.0$, $0<y<1.5$, $0<z<0.05$, $0 \le a<0.5$, $0 \le c<1.5$, $y+c<1.5$, and Mt is at least one element selected from Al, Ga and In; and the MGF phosphor is adapted to absorb at least a portion of the blue light emitted from the light emitting element to emit red light. The sulfide phosphor-containing layer includes a sulfide phosphor having the chemical formula $M^1Ga_2S_4$:Eu (3) which is a thiogallate phsophor activated with Eu, where $M^1$ is at least one selected from Mg, Ca, Sr and Ba; and the sulfide phosphor is adapted to absorb at least a portion of the blue light emitted from the light emitting element to emit green light.

Using the above-described embodiment, a light emitting device that achieves high luminous efficiency while utilizing a green sulfide phosphor can be provided.

DETAILED DESCRIPTION OF THE EMBODIMENTS

Figure 1:
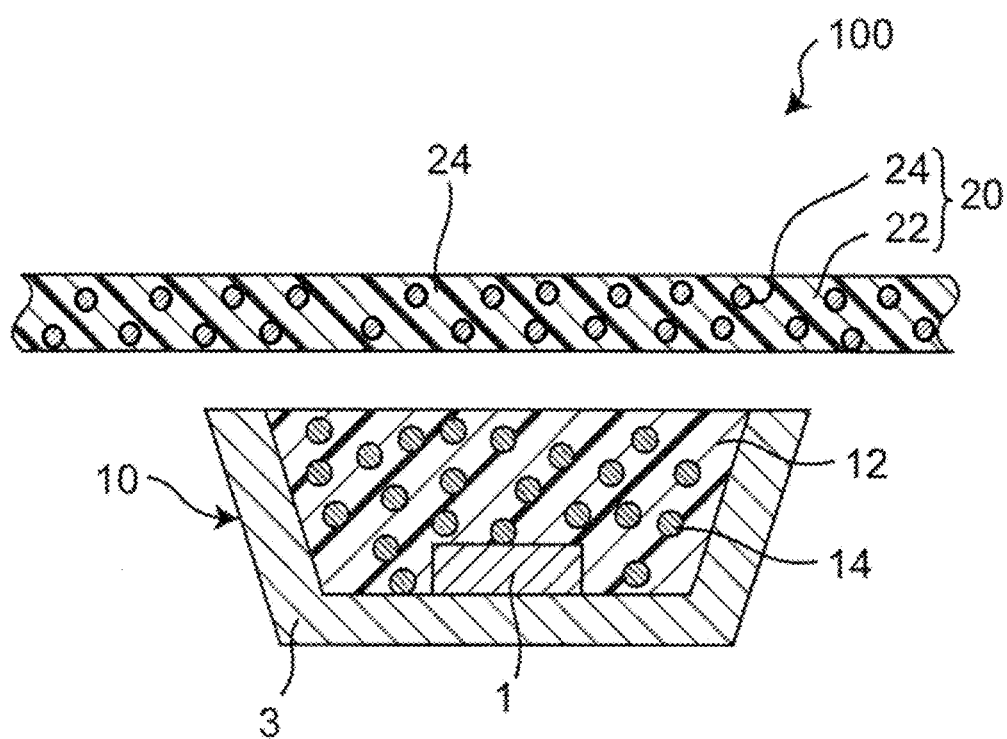
FIG. 1 is a schematic cross-sectional view showing a light emitting device 100 according to a first embodiment.

Embodiments according to the present invention will be described below with reference to the drawings. It is to be understood that the embodiments described below are intended as illustrative to give a concrete form to technical ideas of the present invention, and thus the technical scope of the invention shall not be limited to those described below. The arrangements illustrated in one embodiment can also be applied to other embodiments, unless otherwise specified. In the description below, if necessary, the terms indicative of the specific direction or position (for example, "upper", "lower", "right", "left", and other words including these words) are used for easy understanding of the present invention with reference to the figures. The meanings of the terms are not intended to restrict the technical range of the present invention. It is understood that in some drawings, the sizes or positional relationships of members are emphasized to clarify the description below and are not limiting. The same parts or members are designated by the same reference character throughout the drawings. Further, a member denoted by a combination of a numerical number and a letter, for example, a reference character "10A", may have the same structure as that of a member denoted by the same numerical number without any letter, for example, a reference character "10", or that of a member denoted by a combination of the same numerical number and a different letter unless otherwise specified.

As a result of intensive studies, the inventors have discovered that a light emitting device that uses a green sulfide phosphor can obtain high light emitting efficiency with the use of at least one of a KSF phosphor and a MGF phosphor as the red phosphor in place of a conventional red phosphor. The KSF phosphors and the MGF phosphors to be described in detail below absorb blue light emitted from a light emitting element and emit red light, and absorb little green light emitted from a green sulfide phosphor. That is, a secondary absorption is substantially reduced or does not occur. Thus, the light emitting devices according to certain embodiments of the present invention have high luminous efficiency. The peak of the emission spectrum of each of the KSF phosphors and the MGF phosphors has a narrow full width at half maximum of about 10 to 20 nm. Accordingly, red light having a narrow full width at half maximum can be obtained even through a color filter that allows the light in the substantially whole red wavelength range to pass therethrough, so that red light of high color purity can be obtained.

Further, a KSF phosphor is contained in the sealing member and disposed closer to the light emitting element and the sulfide phosphor that has less robust temperature characteristic is disposed spaced apart from the light emitting element. Thus, the influence of the heat from the light emitting element on the sulfide phosphor can be reduced, so that degradation of the luminous efficiency can be suppressed.

The KSF phosphor absorbs a small amount of blue light, so that in the case of obtaining a white light source, a greater amount of the KSF phosphor is needed to be contained than a conventional red phosphor. However, in the case where a KSF phosphor is contained in a phosphor sheet with a green phosphor as described in JP 2014-24918A, the thickness of the phosphor sheet increases due to the large content of the KSF phosphor. In the recent backlight light sources, the demand for thinner light sources has progressed and, consequently, the thickness of the phosphor sheet must be reduced.

Accordingly, in the certain embodiments of the present invention, the KSF phosphor that is needed in a larger amount than a conventional red phosphor is contained in a sealing member and is disposed close to a light emitting element to reduce the necessary amount of the KSF phosphor to a minimum, while disposing a thermally sensitive sulfide phosphor at an outer side (light extracting side) of the sealing member. With this arrangement, the KSF phosphor can be used without increasing the thickness of the sulfide phosphor-containing layer (i.e. the phosphor sheet). The reduction in the amount of the phosphor can also lead to a reduction in the cost. Light emitting devices according to several embodiments of the present invention will be described below in detail.

First Representative Embodiment

FIG. 1 shows a schematic cross-sectional view of a light emitting device 100 according to a first embodiment. The light emitting device 100 includes a light emitting element 1 adapted to emit a blue light, a green phosphor 24 to absorb a portion of the blue light emitted from the light emitting element 1 to emit a green light, and a red phosphor 14 to absorb a portion of the blue light emitted from the light emitting element 1 to emit a red light. The red phosphor 14 is at least one of a KSF phosphor and a MGF phosphor which will be described in detail below.

In the light emitting device according to the present embodiment, with respect to the light emitting element 1, the red phosphor 14 is disposed closer than the green sulfide phosphor 24.

The light emitting device 100 includes a light emitting element package 10. The light emitting element package 10 includes a resin package 3 having a bottom surface and sidewalls that defining a cavity opening upward, a light emitting element 1 disposed on the bottom surface in the cavity of the resin package 3, and a sealing resin 12 filled in the cavity of the resin package 3. The light emitting element 1 has its positive electrode and negative electrode connected to an external power source via conductive members, such as a metal wire, a metal bump or a plated member. Upon being supplied with electric current (electric power) from the external power source, the light emitting element 1 emits a blue light. A lead may be disposed at the bottom surface in the cavity of the resin package 3, and the light emitting element 1 may be disposed on the lead. In the case of using the lead, the lead may be connected to the negative electrode and/or the positive electrode by a metal wire, to connect the light emitting element 1 to the external power source via the lead. Instead of using the metal wire, flip-chip bonding can be performed with the use of a solder. The lead may have a plated layer on its surface as needed. The sealing resin 12 covers surfaces of the light emitting element 1 (in the embodiment shown in FIG. 1, the upper surface and the side surfaces of the light emitting element 1 but not the bottom surface). The sealing resin 12 contains the red phosphor 14.

That is, the red phosphor 14 is distributedly arranged in the sealing rein 12. Note that, although in the embodiment shown in FIG. 1, the red phosphor 14 is uniformly dispersed in the sealing resin 12, the form of distribution of the red phosphor is not limited thereto. Alternatively, the red phosphor 14 may be disposed at a higher density in a portion of the sealing resin 12, for example, may be disposed at a high density near the light emitting element 1. One example of such an arrangement can be so-called "sedimentation arrangement" in which, the distribution density of the red phosphor is smaller at an upper part of the sealing resin 12 and higher at the bottom of the sealing resin 12 (including a portion directly above the light emitting element 1). The sedimentation arrangement can be formed, for example, by filling uncured sealing resin 12 with the red phosphor 14 uniformly distributed therein into the cavity of the resin package 3, standing the sealing resin 12 for a predetermined time while keeping it in the uncured state, allowing the red phosphor 14 in the sealing resin 12 to settle by gravity, and after the density of the red phosphor becomes high at the bottom of the sealing resin 12, then, hardening the sealing resin 12. Alternatively, the red phosphors may be settled by a centrifugal force. In addition to the red phosphors 14, fillers may be distributed in the sealing resin 12.

The light emitting element package 10 has its upper surface serving as an emission surface and is configured to emit a blue light and a red light. More specifically, a portion of the blue light emitted from the light emitting element 1 passes through the sealing resin 12 and is emitted from the upper surface of the sealing resin 12 to the outside. A portion of the blue light emitted from the light emitting element package 10 may be reflected at a side surface and/or the bottom surface of the resin package 3 while propagating inside the sealing resin 12, and then be emitted from the upper surface of the sealing resin 12. Another portion of the blue light emitted from the light emitting element 1 may be absorbed in the red phosphor 14 while propagating through the sealing resin 12, whereby the red phosphor 14 is excited to emit a red light. The red light emitted from the red phosphor 14 passes through the sealing resin 12 and is emitted from the upper surface of the sealing resin 12 toward the outside. A portion of the red light emitted from the red phosphor 14 is reflected at the side surfaces and/or the bottom surface of the resin package 3 while propagating through the sealing resin 12, and then is emitted from the upper surface of the sealing resin 12.

A green sulfide phosphor-containing layer 20 is disposed at an outer side of the sealing resin 12, that is, in FIG. 1, over the sealing resin 12 (or resin package 3). The green sulfide phosphor-containing layer 20 includes a light-transmissive material 22 and the green sulfide phosphor 24. That is, the green sulfide phosphor 24 is distributedly arranged in the light-transmissive material 22. The green sulfide phosphor-containing layer 20 may have any appropriate form. One preferable form of the green phosphor-containing layer 20 is a sheet shape (or film shape) as shown in FIG. 1. This is because the thickness of the green sulfide phosphor-containing layer 20 can be made uniform to suppress color unevenness.

With this arrangement, in the light emitting device 100, with respect to the light emitting element 1, the red phosphor 14 is disposed closer than the green sulfide phosphor 24. The KSF phosphor or the MGF phosphor, which is required in a greater amount than the green sulfide phosphor for wavelength conversion, is disposed closer to the light emitting element and the green sulfide phosphor is disposed farther from the light emitting element 1. Thus, the necessary amount of the red phosphor can be reduced, which leads to further improvement in the light extraction efficiency (that is, light emitting efficiency).

A large portion of the red light emitted from the upper surface of the light emitting element package 10 propagates into the green sulfide phosphor-containing layer 20 from its lower surface, passes through the light-transmissive material 22 of the green sulfide phosphor-containing layer 20, and then exits from the upper surface of the green sulfide phosphor-containing layer 20 to the outside. A large portion of the blue light emitted from the upper surface of the light emitting element package 10 enters the green sulfide phosphor-containing layer 20 from its lower surface. A portion of the blue light that has entered the green sulfide phosphor-containing layer 20 from the lower surface passes through the light-transmissive material 22 of the green sulfide phosphor-containing layer 20, and then exits from the upper surface of the green sulfide phosphor-containing layer 20 to the outside. Another portion of the blue light that has entered the green sulfide phosphor-containing layer 20 from its lower surface is partially absorbed in the green sulfide phosphor 24, whereby the green sulfide phosphor 24 emits green light. A large portion of the green light emitted from the green sulfide phosphor 24 propagates through the light-transmissive material 22 and then exits from the upper surface of the green sulfide phosphor-containing layer 20 to the outside. As a result, a white light that is a mixture of the blue light, the red light, and the green light can be obtained outside the upper surface of the green sulfide phosphor-containing layer 20.

Note that a portion of the green light emitted from the green sulfide phosphor 24 propagates downward and exits from the lower surface of the green sulfide phosphor-containing layer 20, and then enters the sealing resin 12 from the upper surface of the light emitting element package 10. However, the red phosphor 14, which is at least one of a KSF phosphor and a MGF phosphor, absorbs little green light. Accordingly, a portion of green light emitted from the upper surface of the green sulfide phosphor-containing layer 20 may be the light, for example, that is reflected at the inner surface of the resin package 3 and emitted from the upper surface of the light emitting element package 10, then enters the green sulfide phosphor-containing layer 20 from its lower surface and then is emitted from the upper surface of the green sulfide phosphor-containing layer 20. The presence of such green light contributes to improving the light extraction efficiency of the light emitting device 100.

In the embodiment shown in FIG. 1, the green sulfide phosphor-containing layer 20 and the sealing resin 12 (or resin package 3) are spaced apart from each other. Thus, the light emitting device can have the effect of more surely suppressing the transfer of heat generated from the light emitting element 1 to the green sulfide phosphor 24, which is sensitive to heat. The arrangement, however, is not limited thereto, and alternatively, the green sulfide phosphor-containing layer 20 and the sealing resin 12 (or resin package 3) may be in contact with each other. In this case, a larger amount of light emitted from the light emitting element package 10 is allowed to enter the green sulfide phosphor-containing layer 20, so that the light extraction efficiency can be further improved. Moreover, even in the case where the green sulfide phosphor-containing layer 20 is in contact with the sealing resin 12 (or resin package 3), the light emitting element 1 is spaced apart from the green sulfide phosphor 24 to some degree, so that thermal degradation of the green sulfide phosphor 24 can be suppressed.

In the embodiment shown in FIG. 1, the light emitting element package 10 is a top-view type package in which the mounting surface is the bottom surface (lower surface); that is, the mounting surface is at the opposite side to the light extraction surface (for example, the upper surface serves as the light extraction surface and the lower surface serves as the mounting surface). However, the light emitting element package 10 is not limited thereto, and the light emitting element package 10 may be structured as a so-called side view type, in which a surface adjacent to the light extraction surface serves as the mounting surface. In the embodiment shown in FIG. 1, the light emitting element package 10 that includes the resin package 3 is used, but the light emitting device is not limited thereto. In place of the light emitting element package 10, a so-called "packageless type" may be employed, in which a phosphor layer containing the red phosphor 14 is formed on the surface of the light emitting element 1 without having a resin package.

Figure 2:
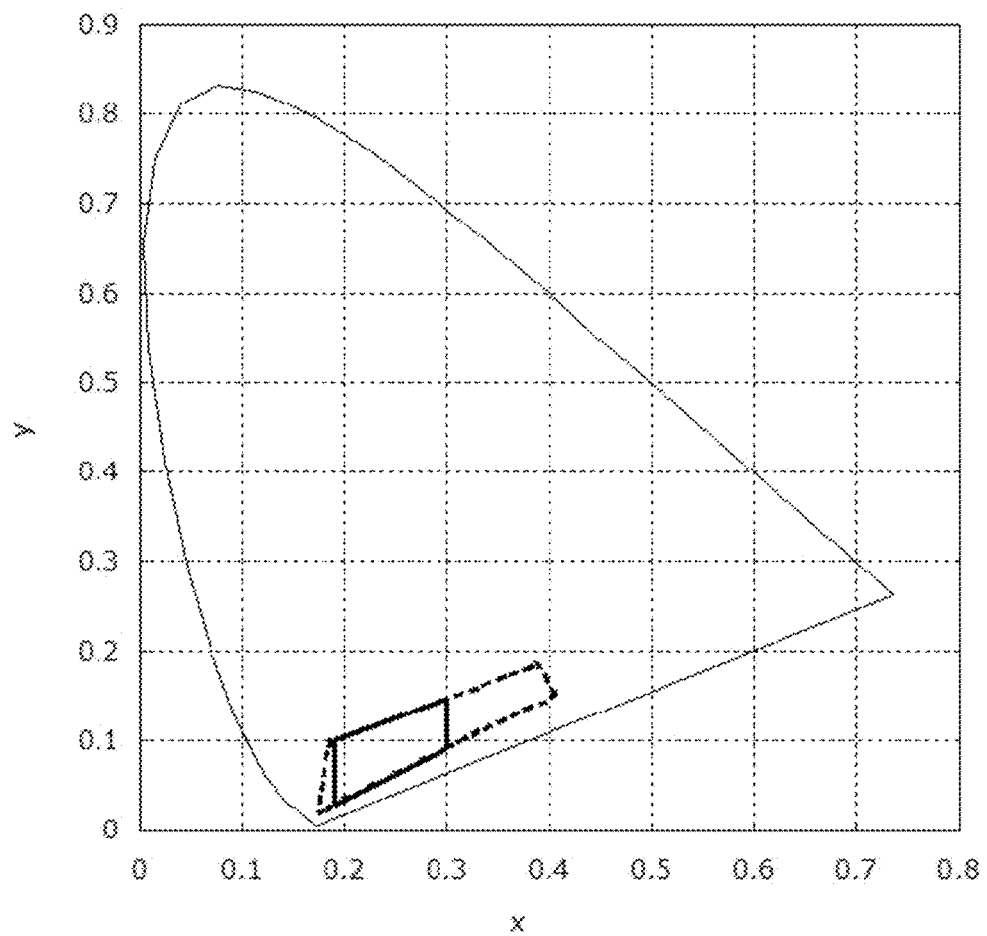
FIG. 2 shows preferable chromaticity ranges for light emitted from a light emitting element package 10 on chromaticity coordinate.

FIG. 2 is a diagram showing preferable chromaticity ranges of the light emitted from embodiments of the light emitting element package 10 (i.e. the light entering the green sulfide phosphor-containing layer 20) on chromaticity coordinates. The chromaticity of light emitted from the light emitting element package 10 is preferably in a quadrangular region indicated by dashed lines in FIG. 2 (i.e. a quadrangular region formed by connecting four points of (0.4066, 0.1532), (0.3858, 0.1848), (0.1866, 0.0983) and (0.1706, 0.0157) on an x-y chromaticity coordinate system of a CIE1931 chromaticity diagram). The chromaticity of light emitted from the light emitting element package 10 is more preferably in a quadrangular region indicated by solid lines in FIG. 2 (i.e. a quadrangular region formed by connecting four points of (0.19, 0.0997), (0.19, 0.027013), (0.3, 0.09111) and (0.3, 0.014753) on an x-y chromaticity coordinate system of a CIE1931 chromaticity diagram). With the chromaticity within such regions, under the presence of the green sulfide phosphor-containing layer 20, a color tone suitable for back light can be achieved.

Figure 3A:
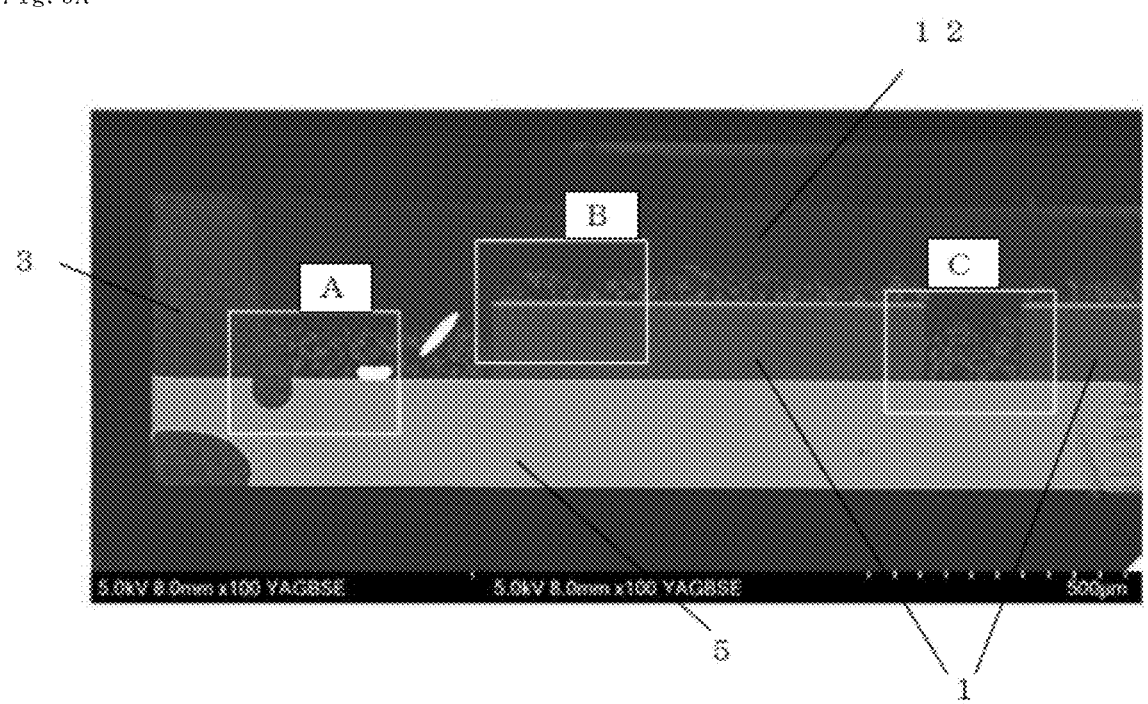
FIG. 3A shows a SEM image of a cross section of part of a thus obtained light emitting element package 10.
Figure 3B:
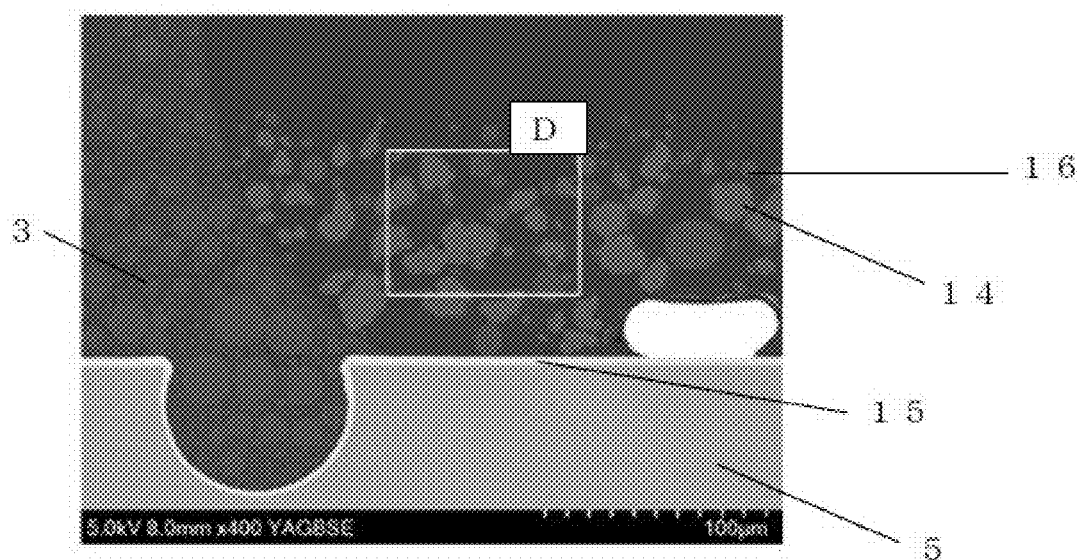
FIG. 3B shows an enlarged SEM image of portion A shown in FIG. 3A.
Figure 3C:
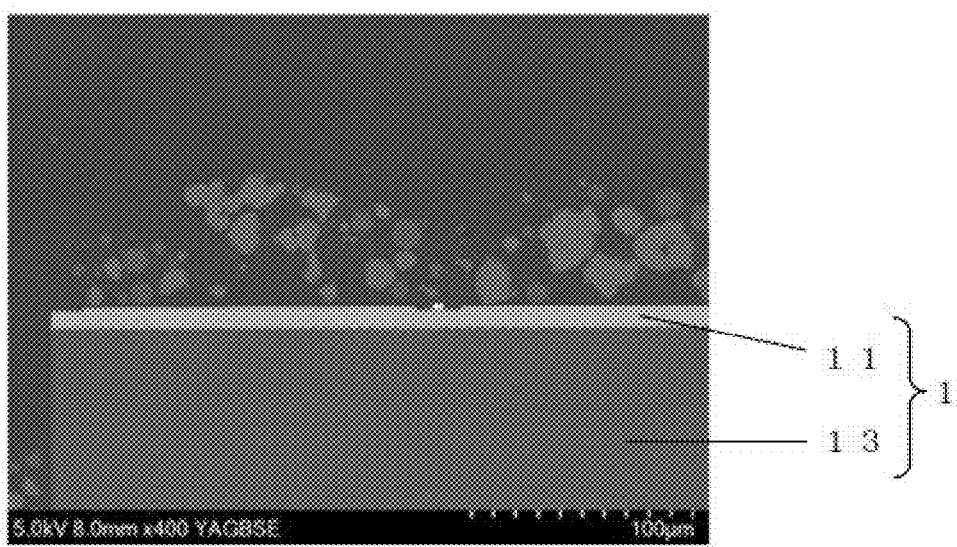
FIG. 3C shows an enlarged SEM image of portion B shown in FIG. 3A.
Figure 3D:
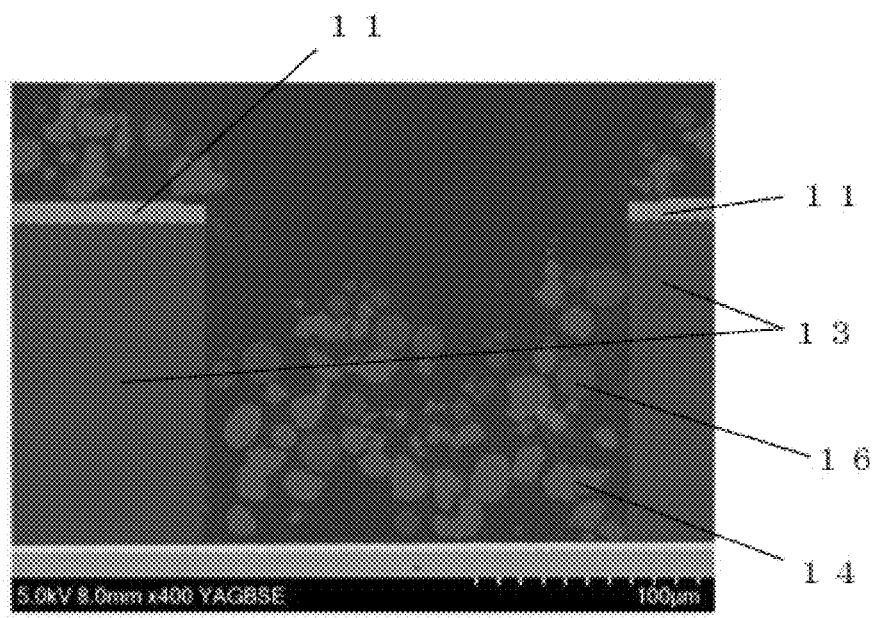
FIG. 3D shows an enlarged SEM image of portion C shown in FIG. 3A.
Figure 3E:
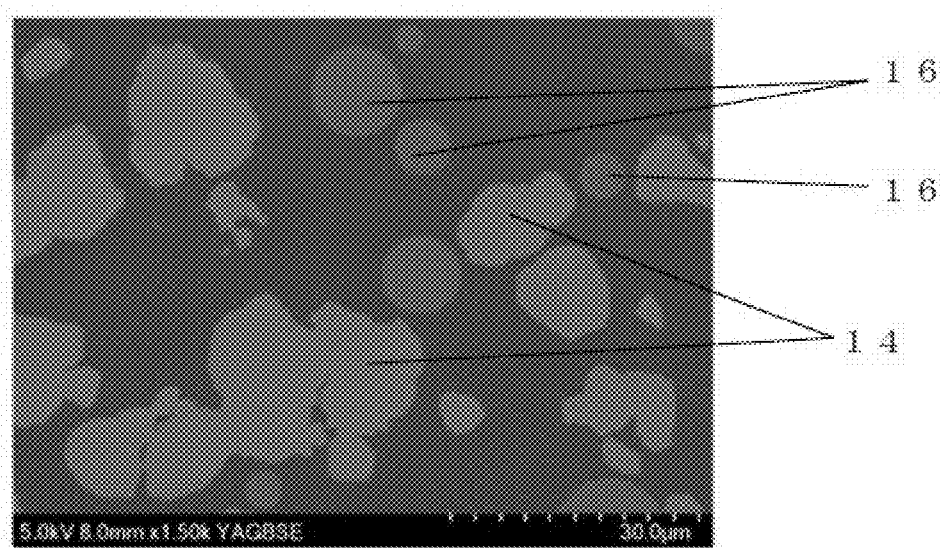
FIG. 3E shows an enlarged SEM image of portion D shown in FIG. 3B.

A light emitting element package 10 to emit light of the chromaticity within those regions were prepared and the emission spectrum were measured, as described below. FIG. 3A shows a SEM image of a cross section of a portion of the light emitting element package 10. FIG. 3B shows an enlarged SEM image of the portion A shown in FIG. 3A. FIG. 3C shows an enlarged SEM image of the portion B shown in FIG. 3A. FIG. 3D shows an enlarged SEM image of the portion C shown in FIG. 3A, and FIG. 3E shows an enlarged SEM image of the portion D shown in FIG. 3B. A resin package 3 was provided with a cavity defined in a substantially square shape with rounded corners in the top view, with an outside dimensions of 4 mm in length, 1.4 mm in width and 0.6 mm in height. The resin package 3 was provided with a pair of leads 5 on the bottom in the cavity, and each of the leads 5 had a plated layer on its surfaces. A light emitting element 1 having a light-transmissive substrate 13 and a semiconductor layer 11 was disposed on one of the pair of leads 5. The light emitting element 1 was electrically connected to the pair of leads 5 by gold wires, respectively.

The sealing resin 12 was disposed such that a silicon resin having the red phosphor 14 and the filler 16 distributed therein was disposed in the cavity of the resin package 3, and then, the red phosphor 14 and the filler 16 were centrifugally sedimented to form a sealing resin 12. For the red phosphor 14, a KSF phosphor ($K_2MnF_6$:$Mn^{4+}$) was used. For the filler 16, a silica filler and a nanosilica filler were used. The sealing resin 12 contained about 17 parts by weight of a KSF phosphor, about 5 parts by weight of a silica filler and about 0.4 parts by weight of a nanosilica filler with respect to 100 parts by weight of the silicone resin. As shown in FIG. 3C, an upper portion of a side surface of the light emitting element 1 was covered with neither the red phosphor 14 nor the filler 16.

Figure 4:
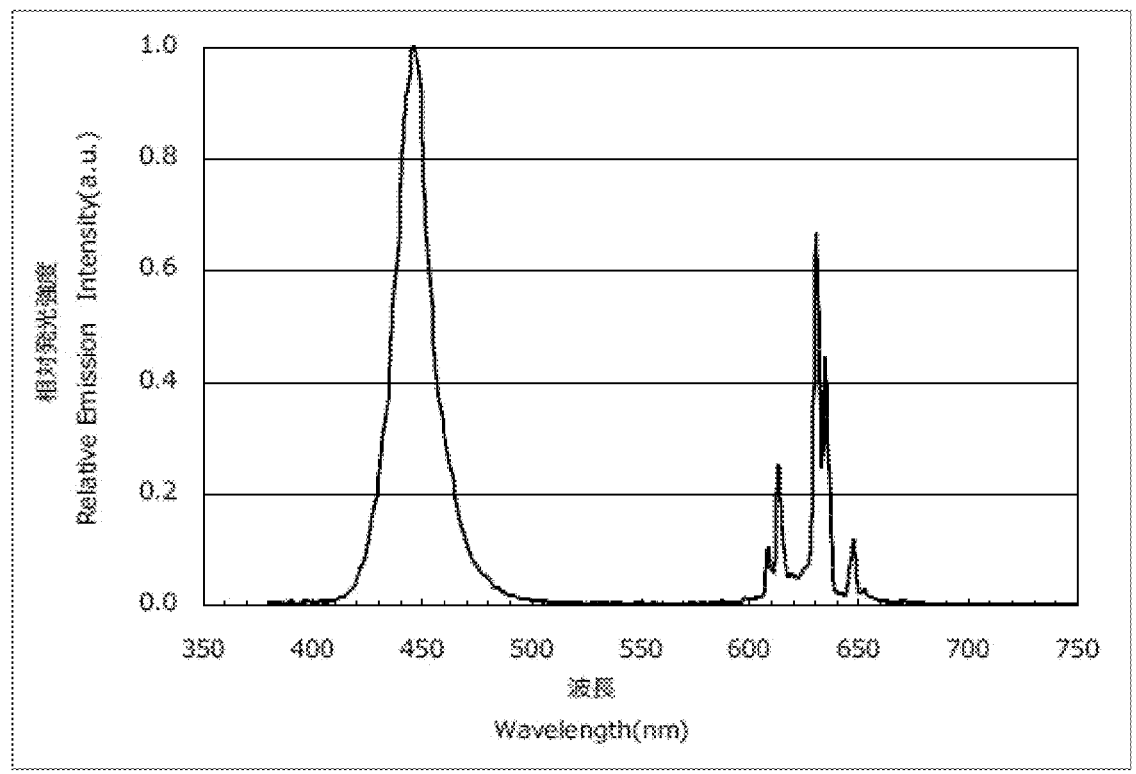
FIG. 4 shows an emission spectrum of the thus obtained light emitting element package 10.

FIG. 4 shows an emission spectrum of the light emitting element package 10 thus obtained. The light emitting element 1 emits light of a wavelength mainly between 430 nm and 480, and the red phosphor 14 emits light of a wavelength mainly between 600 nm and 660. The emission spectrum has a first peak wavelength at 447 nm at which the highest emission intensity is obtained, and a second peak wavelength at 631 nm at which the highest emission intensity of the red phosphor 14 is obtained. The ratio of the emission intensity at the first wavelength of the emission peak to the emission intensity at the second wavelength of the emission peak is 100:67 (i.e. the first emission intensity: the second emission intensity=100:67). The values of chromaticity coordinates in the CIE 1931 system were x=0.216 and y=0.054.

Next, the respective elements of the light emitting device 100 will be described in detail.

1) Light Emitting Element

The light emitting element 1 may be of any appropriate known light emitting element or blue LED chip, as long as it can emit a blue light (with the emission peak wavelength in a range of 435 to 465 nm). The light emitting element 1 may include a semiconductor stacked-layer body, and preferably includes a nitride semiconductor stacked-layer body. The semiconductor stacked-layer body (preferably, nitride semiconductor stacked-layer body) may include a first semiconductor layer (for example, an n-type semiconductor layer), an emission layer, and a second semiconductor layer (for example, a p-type semiconductor layer) in this order. More specifically, $In_XAl_YGa_{1-X-Y}N$ ($0 \leq X$, $0 \leq Y$, $X+Y \leq 1$) may be suitably used for a nitride semiconductor material. The thickness and the layer structure of each layer may be those known in the art.

2) Red Phosphor

The red phosphor 14 is at least one of a KSF phosphor and a MGF phosphor. The KSF phosphors and the MGF phosphors barely absorb green light, and thus are advantageous that secondary absorption barely occurs. The red phosphors have a half-width of the emission peak of 35 nm or less, and preferably 10 nm or less. The particle diameter is, for example, 20 to 50 μm (average particle diameter). In the present specification, the value of the average particle diameter is indicated as a F.S.S.S.No (Fisher Sub Sieve Sizer's No) that is determined by using an air permeable method. The KSF phosphors and the MGF phosphors will be described in detail below.

KSF Phosphor

The KSF phosphors are a red phosphor having the wavelength of the emission peak in a range of 610 to 650 nm. The composition of the KSF phosphors is represented by the following chemical formula (1):

$$A_2[M_{1-a}Mn^{4+}{}_aF_6] \tag{1}$$

where A is at least one selected from the group consisting of $K^+$, $Li^+$, $Na^+$, $Rb^+$, $Cs^+$ and $NH_4^+$; M is at least one element selected from the group consisting of Group 4 elements and Group 14 elements; and 0<a<0.2.

The full width at half maximum of the emission peak of the KSF phosphor is 10 nm or less. Examples of KSF phosphors are disclosed by Japanese Patent Application No. 2014-122887 and U.S. Pat. No. 9,120,972, filed by the applicant of the present application. The entire contents of Japanese Patent Application No. 2014-122887 and U.S. Pat. No. 9,120,972 are incorporated herein by reference.

One embodiment of a method of manufacturing a KSF phosphor will be described below. First, $KHF_2$ and $K_2MnF_6$ are weighed to attain a desired composition ratio. The weighed $KHF_2$ is dissolved in an HF aqueous solution thereby preparing a solution A. The weighed $K_2MnF_6$ is dissolved in the HF aqueous solution, thereby preparing a solution B. Further, an aqueous solution containing $H_2SiF_6$ is prepared to attain a desired composition ratio, producing a solution C containing the $H_2SiF_6$. Each of the solutions B and C is dripped into the solution A while stirring the solution A at room temperature. The solution containing the thus obtained precipitate is subjected to solid-liquid separation, washed with ethanol, and then dried to produce a KSF phosphor.

MGF Phosphor

The MGF phosphors are red phosphors that emit a deep-red fluorescence. That is, the MGF phosphors are activated with $Mn^{4+}$ and have a wavelength of the emission peak of 650 nm or more, which is located at a longer wavelength side than the peak emission wavelength of the KSF phosphors. One example of the composition of the MGF phosphors is represented by the following chemical formula: $3.5MgO.0.5MgF_2.GeO_2:Mn^{4+}$. The MGF phosphors have a full width at half maximum of 15 nm to 35 nm.

In the MGF phosphors, Mg in MgO in the composition may be partially substituted by another element, such as Li, Na, K, Sc, Y, La, Ce, Pr, Nd, Pm, Sm, Eu, Gd, Tb, Dy, Ho, Er, Tm, Yb, Lu, V, Nb, Ta, Cr, Mo, W, or the like, and/or the Ge in $GeO_2$ may be partially substituted by another element, such as B, Al, Ga, In, or the like, in order to improve the luminous efficiency. It is preferable that substituting Mg and Ge by Sc and Ga, respectively, can further improve the emission intensity of light in a wavelength range of 600 to 670 nm, which is called a deep red.

The MGF phosphors are represented by the following chemical formula (2):

$$(x-a)MgO.(a/2)Sc_2O_3.yMgF_2.cCaF_2.(1-b)GeO_2.(b/2)Mt_2O_3.zMn^{4+} \quad (2)$$

where x, y, z, a, b and c satisfy $2.0 \leq x \leq 4.0$, $0 < y < 1.5$, $0 < z < 0.05$, $0 \leq a < 0.5$, $0 < b < 0.5$, $0 < c \leq 1.5$ and $y+c < 1.5$, and Mt is at least one element selected from Al, Ga and In.

In the chemical formula (2), a and b are set to satisfy $0.05 \leq a < 0.3$ and $0.05 \leq b < 0.3$. Thus, the brightness of the emitted red light can be improved. Examples of MGF phosphors are disclosed by Japanese Patent Application No. 2014-113515, filed by the applicant of the present application. The entire contents of Japanese Patent Application No. 2014-113515 is incorporated herein by reference.

One embodiment of a method of manufacturing a MGF phosphor in the embodiment of the present invention will be described below. First, MgO, $MgF_2$, $Sc_2O_3$, $GeO_2$, $Ga_2O_3$, and $MnCO_3$ are weighed as raw materials to attain the desired composition ratio. After mixing these raw materials together, the mixture is charged into a cruicible and calcined at a temperature of 1000 to 1300° C. under atmosphere, thus producing a MGF phosphor. The ratio of the emission intensity at the peak wavelength of the light emitting element to the emission intensity at the peak wavelength the red phosphor is preferably 100:55 to 70 (i.e. the first: the second=100:55 to 70).

3) Green Sulfide Phosphor

The green sulfide phosphor 24 is a phosphor represented by the chemical formula (3):

(3) is a thiogallate phsophor activated with Eu where $M^1$ is at least one selected from Mg, Ca, Sr and Ba. The green sulfide phosphor 24 may have a particle size (average particle size), for example, of 5 to 20 μm. The green sulfide phosphor 24 emits a green light having a wavelength of the emission peak in a range of e.g., 520 to 560 nm. A full width at half maximum of the emission peak wavelength of the green sulfide phosphor 24 may be 55 nm or less and preferably 50 nm or less.

4) Light-Transmissive Material

The light-transmissive material 22 allows the blue light, the green light and the red light to pass therethrough. The light-transmissive material allows transmittance of preferably 60% or more, more preferably 70% or more, still more preferably 80% or more, and most preferably 90% or more of the light emitted from the light emitting element 1 and incident on the light-transmissive material 22. Examples of suitable light-transmissive material 22 include, high strain point glass, soda glass ($Na_2O.CaO.SiO_2$), borosilicate glass ($Na_2O.B_2O_3.SiO_2$), forsterote ($2MgO.SiO_2$), lead glass ($Na_2O.PbO.SiO_2$), and alkali-free glass. Examples of suitable light-transmissive material 22 also include organic polymers (that may take the forms of polymer material, such as a plastic film, a plastic sheet, and a plastic substrate, each of which is made of a polymer material and has flexibility), the examples include, a polymethyl methacrylate (PMMA), a polyvinyl alcohol (PVA), a polyvinyl phenol (PVP), a polyethersulfone (PES), a polyimide, a polycarbonate (PC), a polyethylene terephthalate (PET), a polystyrene (PS), a polyethylene naphthalate (PEN), a cyclic amorphous polyolefin, a multifunctional acrylate, a multifunctional polyolefin, an unsaturated polyester, an epoxy resin and a silicone resin.

Figure 5A:
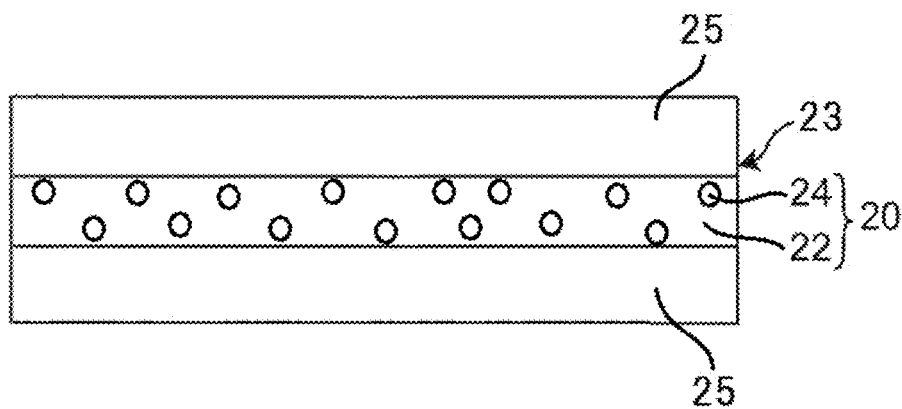
FIG. 5A is a schematic cross-sectional view showing an example of a phosphor sheet according to an embodiment of the present invention.
Figure 5B:
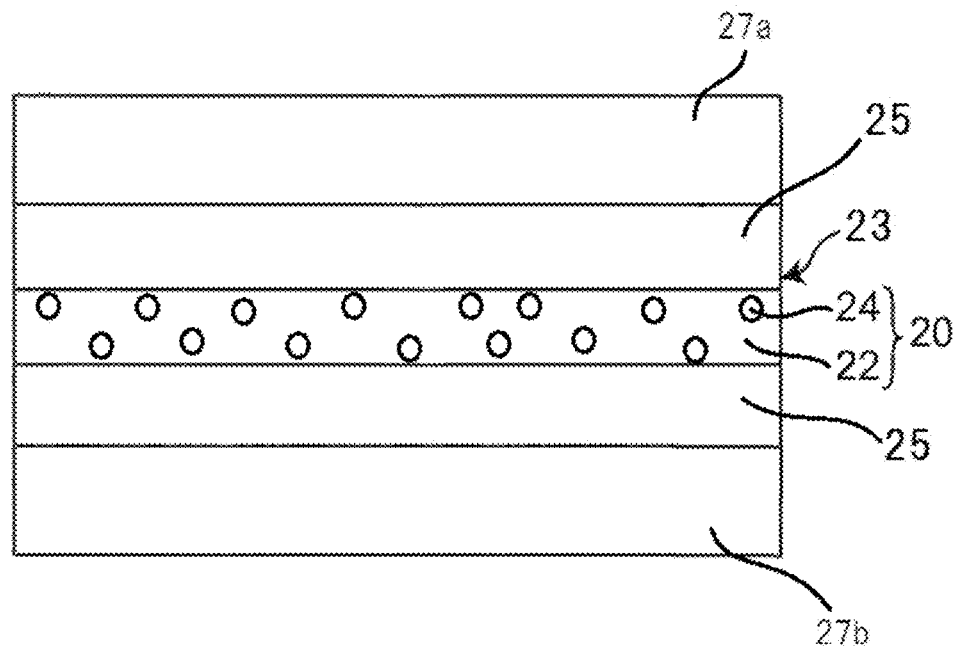
FIG. 5B is a schematic cross-sectional view showing an example of a phosphor sheet according to an embodiment of the present invention.

For example, in the case of forming in a sheet shape, the sheet may be a single sheet containing a sulfide phosphor as shown in FIG. 1, or the sheet containing a sulfide phosphor may be disposed between two transparent layers as shown in FIG. 5A. For example, the phosphor sheet 23 shown in FIG. 5A can be fabricated such that, a sulfide phosphor-containing resin composition is disposed on a transparent layer 25 to form a green sulfide phosphor-containing layer 20 and another transparent layer 25 is stacked on the green sulfide phosphor-containing layer 20. Alternatively, the phosphor sheet 23 having a structure shown in FIG. 5B can be fabricated such that, a phosphor sheet 23 is placed between two sealing films 27a and 27b and the whole is thermally compressed.

The green sulfide phosphor-containing layer has a thickness of preferably 10 to 100 μm, more preferably 20 to 40 μm.

For the transparent layer 25, a thermoplastic resin film, a thermosetting resin film, or an optically curable resin film with a thickness of 10 to 100 μm can be used. Examples thereof include a polyester film, a polyamide film, a triacetylcellulose film, and a polyolefin film. In order to improve adhesion to the phosphor-containing resin compound, the surfaces of those films may be subjected to a plasma treatment as needed.

5) Sealing Resin

The sealing resin 12 allows the blue light and the red light to pass therethrough, and preferably also allows the green light to pass therethrough. The light-transmissive material allows transmittance of preferably 60% or more, more preferably 70% or more, still more preferably 80% or more, and most preferably 90% or more of the light emitted from the light emitting element 1 and incident on the light-transmissive material 22. Examples of suitable materials for the sealing resin 12 include, a silicone resin, a modified silicone resin, an epoxy resin, a modified epoxy resin, a phenol resin, a polycarbonate resin, an acrylic resin, a TPX resin, a polynorbornene resin, or a hybrid resin containing one or more kinds of these resins. Of these resins, the silicone resin or epoxy resin is preferable, because of its good resistance to light and heat. The epoxy resin is also a preferable resin.

6) Resin Package

The resin package 3 may be formed of any suitable resin. Examples of preferable resins include, a thermoplastic resin containing at least one of an aromatic polyamide resin, a polyester resin, and a liquid crystal resin; or a thermosetting resin containing at least one of an epoxy resin, a modified epoxy resin, a phenol resin, a silicone resin, a modified silicone resin, a hybrid resin, an acrylate resin, a urethane resin. The resin package 3 is preferably formed of a white resin. This is because more of the light propagates through the sealing resin 12 and reaches the resin package 3 can be reflected.

Second Representative Embodiment

Figure 6:
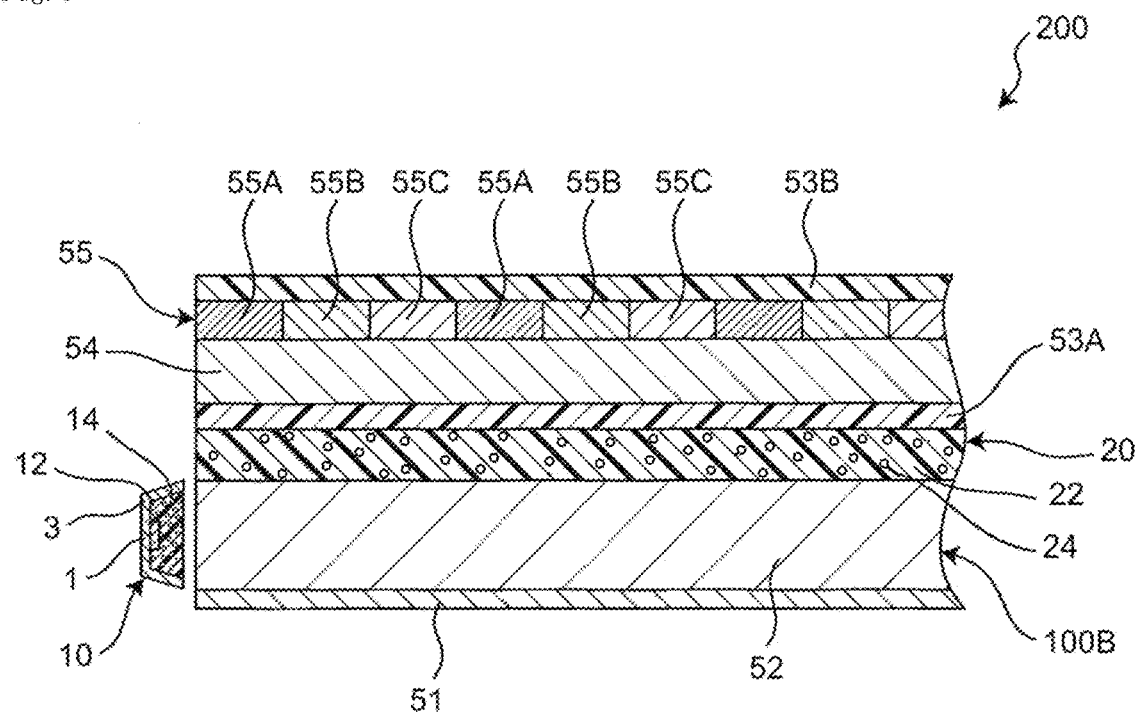
FIG. 6 is a schematic cross-sectional view showing a liquid crystal display 200 that uses a light emitting device 100B according to a second embodiment.

FIG. 6 is a schematic cross-sectional view showing a liquid crystal display 200 that has a light emitting device 100B according to a second embodiment. The light emitting device 100B includes the light emitting element package 10, the green sulfide phosphor-containing layer 20, and a light guide plate 52 disposed between the light emitting element package 10 and the green sulfide phosphor-containing layer 20. In the embodiment shown in FIG. 6, the light guide plate 52 is disposed between the sealing resin 12 of the light emitting element package 10 and the green sulfide phosphor-containing layer 20. More specifically, the sealing resin 12 is arranged facing one side surface of the light guide plate 52, and the green sulfide phosphor-containing layer 20 is disposed facing the upper surface of the light guide plate 52. In the embodiment shown in FIG. 6, the light emitting element package 10 is of a top-view type, but is not limited thereto, and may have any other form, such as the side-view type described above.

The light emitting device 100B may include a reflecting plate (reflector) 51 on the lower surface of the light guide plate 52 to upwardly reflect a portion of the light entering the light guide plate 52 through the light emitting element package 10 and reaching the lower surface of the light guide plate 52, and then to direct the reflected light toward the upper surface of the light guide plate 52.

In the embodiment shown in FIG. 6, the light emitting element package 10 is disposed spaced apart from the light guide plate 52, but is not limited thereto. The light emitting element package 10 and the light guide plate 52 may be arranged in contact with each other by, for example, arranging the sealing resin 12 or the resin package 3 in contact with the side surface of the light guide plate 52. The green sulfide phosphor-containing layer 20 may be arranged in contact with the upper surface of the light guide plate 52, or spaced apart from the light guide plate 52.

A lower polarizing film 53A is disposed on the green sulfide phosphor-containing layer 20. A liquid crystal cell 54 is disposed on the lower polarizing film 53A, and a color filter array 55 is disposed on the liquid crystal cell 54. The color filter array 55 includes a plurality of kinds of color filter portions corresponding to different colors, each filter portion allowing only the light of a specific color to pass therethrough. The color filter portions include, for example, red color filter portions 55A, green color filter portions 55B and blue color filter portions 55C. An upper polarizing film 53B is disposed on the color filter array 55.

Next, the operation of the liquid crystal display 200 will be described. A portion of blue light emitted from the light emitting element 1 exits from the sealing resin 12. Another portion of the blue light emitted from the light emitting element 1 is absorbed in the red phosphor 14 disposed in the sealing resin 12, and then red light is emitted from the red phosphor 14. The red light emitted from the red phosphor 14 exits through the sealing resin 12. That is, a purple light, which is a mixture of the blue light and the red light, is emitted from the light emitting element package 10. The purple light (blue light+red light) enters the green sulfide phosphor-containing layer 20 via the light guide plate 52. A portion of the blue light entering the green sulfide phosphor-containing layer 20 is absorbed in the green sulfide phosphor 24, whereby the green sulfide phosphor 24 emits a green light. As a result, a white light which is a mixture of the blue light, the green light, and the red light is emitted from the upper surface of the green sulfide phosphor-containing layer 20, and the white light enters a lower polarizing film 53A. A portion of the white light (blue light+green light+red light) entering the lower polarizing film 53A passes through the lower polarizing film 53A to enter the liquid crystal cell 54. A portion of the white light entering the liquid crystal cell 54 passes through the liquid crystal cell 54 to reach the color filter array 55. Further, by providing a prism sheet and/or a film for improving the luminance between the green sulfide phosphor-containing layer 20 and the lower polarizing film 53A, efficient conversion of the blue light can be achieved, so that a desired chromaticity can be obtained with smaller amounts of the phosphors.

The blue light, the green light and the red light reaching the color filter array 55 can pass through the corresponding filter portion. For example, the red light passes through the red color filter portions 55A, the green light passes through the green color filter portions 55B, and the blue light passes through the blue color filter portions 55C. Each of the blue, green and red lights passing through the color filter array 55 can partially pass through the upper polarizing film 53B. In this way, the liquid crystal display 200 can display a desired image. As described above, each of the red light emitted from the red phosphor 14 and the green light emitted from the green sulfide phosphor 24 has a narrow full width at half maximum of the emission peak, and thus has the high color purity. Also, a larger amount of light can pass through the red color filter portions 55A and the green color filter portions 55B, so that the luminous efficiency can be improved.

Third Representative Embodiment

Figure 7:
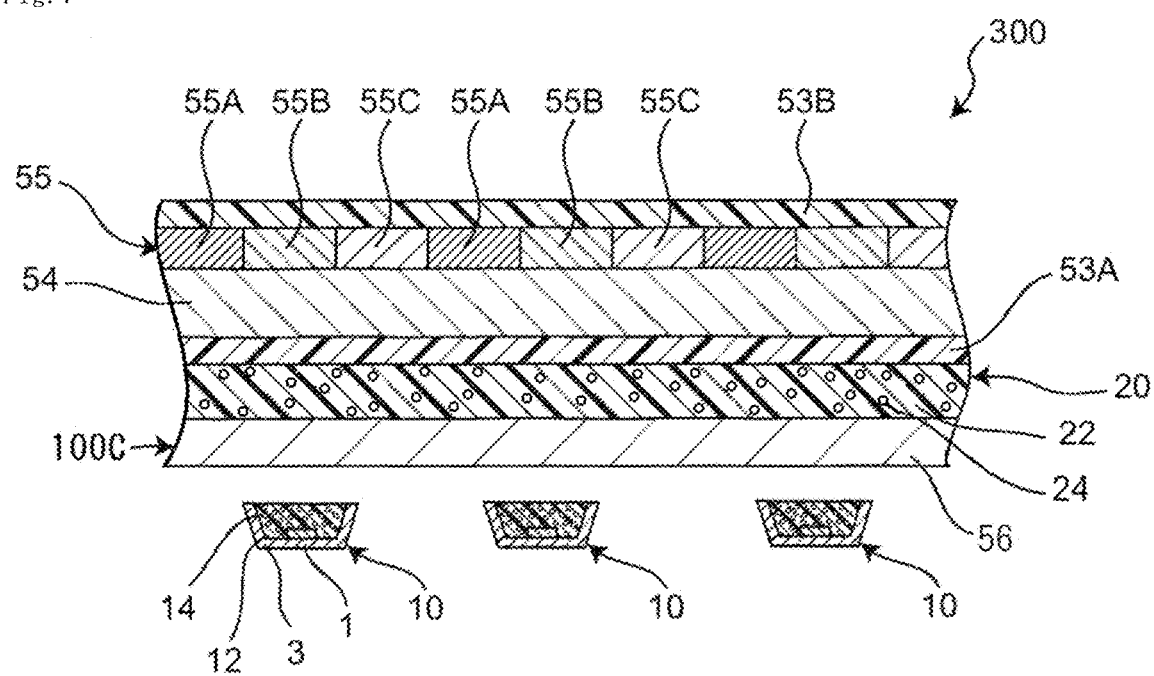
FIG. 7 is a schematic cross-sectional view showing a liquid crystal display 300 that uses a light emitting device 100C according to a third embodiment.

In the second embodiment, an edge-type liquid crystal display is illustrated, but similar effects can be also obtained in a direct-type liquid crystal display. FIG. 7 is a schematic cross-sectional view showing a liquid crystal display 300 that has a light emitting device 100C according to a third embodiment. The light emitting device 100B includes the light emitting element package 10, the green sulfide phosphor-containing layer 20, and a diffusion plate 56 disposed between the light emitting element package 10 and the green sulfide phosphor-containing layer 20. In the case of a direct-type liquid crystal display, a diffusion plate 56 may be disposed between the sealing resin 12 and the sulfide phosphor-containing layer 20 and spaced apart from the sealing resin 12.

Although the disclosure has been described with reference to several exemplary embodiments, it shall be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

The illustrations of the examples and embodiments described herein are intended to provide a general understanding of the various embodiments, and many other examples and embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more examples or embodiments of the disclosure may be referred to herein, individually and/or collectively, by the term "invention" merely for convenience and without intending to voluntarily limit the scope of this application to any particular disclosure or inventive concept. Moreover, although specific examples and embodiments have been illustrated and described herein, it should be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

All of the publications, patent applications and patents cited herein are incorporated herein by reference in their entirety.

What is claimed is:

1. A device comprising:
   a light emitting device comprising:
      a light emitting element adapted to emit a blue light,
      a sealing resin covering the light emitting element, and
      a sulfide phosphor-containing layer disposed separate from the sealing resin; and
   a diffusion plate disposed between the sealing resin and the sulfide phosphor-containing layer, the diffusion plate being spaced apart from the sealing resin,
   wherein the sealing resin includes a red phosphor comprising at least one phosphor selected from the group consisting of:
      a first phosphor, which is a compound having the chemical formula:

$$A_2[M_{1-a}Mn^{4+}_aF_6]$$

where A is at least one selected from the group consisting of $K^+$, $Li^+$, $Na^+$, $Rb^+$, $Cs^+$ and $NH^{4+}$,
         M is at least one element selected from the group consisting of Group 4 elements and Group 14 elements, and
         $0<a<0.2$; and
         the first phosphor is adapted to absorb at least a portion of the blue light emitted from the light emitting element to emit red light, and
      a second phosphor, which is a compound having the chemical formula:

$$(x-a)MgO.(a/2)Sc_2O_3.yMgF_2.cCaF_2.(1-b)GeO_2.(b/2)Mt_2O_3:zMn^{4+}$$

where $2.0 \le x \le 4.0$,
         $0<y<1.5$,
         $0<z<0.05$,
         $0 \le a<0.5$,
         $0<b<0.5$,
         $0 \le c<1.5$
         $y+c<1.5$, and
         Mt is at least one element selected from the group consisting of Al, Ga and In, and
         the second phosphor is adapted to absorb at least a portion of the blue light emitted from the light emitting element to emit red light,
   wherein the sulfide phosphor-containing layer includes a sulfide phosphor having the chemical formula:

$$M^1Ga_2S_4:Eu$$

which is a thiogallate phosphor activated with Eu, where $M^1$ is at least one element selected from the group consisting of Mg, Ca, Sr and Ba, and the sulfide phosphor is adapted to absorb at least a portion of the blue light emitted from the light emitting element to emit green light; and
   wherein the light emitting element is adapted to emit light of a wavelength within a range of 430 nm to 480 nm, the red phosphor is adapted to emit light of a wavelength within a range of 600 nm and 660 nm, a ratio of an emission intensity at a peak wavelength of the light emitting element to an emission intensity at a peak wavelength the red phosphor is in a range of 100:55 to 100:70.

2. The device according to claim 1, wherein the sulfide phosphor-containing layer is formed in a sheet shape.

3. The device according to claim 1, wherein the sulfide phosphor-containing layer has a thickness of 20 to 40 μm.

4. The device according to claim 1, wherein the light emitting element and the sealing resin are parts of a light emitting device that is separate from the sulfide phosphor-containing layer.

5. The device according to claim 4, wherein:
the light emitting device further comprises a package having a bottom surface and sidewalls that define a cavity,
the light emitting element is disposed on the bottom surface of the package, and
the sealing resin is disposed in the cavity of the package.

6. The device according to claim 4, wherein a chromaticity of light emitted from the light emitting device is in a quadrangular region formed by connecting four points of (0.4066, 0.1532), (0.3858, 0.1848), (0.1866, 0.0983) and (0.1706, 0.0157) on an x-y chromaticity coordinate system of a CIE1931 chromaticity diagram.

7. The device according to claim 4, wherein a chromaticity of light emitted from the light emitting device is in a quadrangular region formed by connecting four points of (0.19, 0.0997), (0.19, 0.027013), (0.3, 0.09111) and (0.3, 0.014753) on an x-y chromaticity coordinate system of a CIE1931 chromaticity diagram.

8. The device according to claim 1, wherein the sealing resin includes the first phosphor.

9. The device according to claim 8, wherein the first phosphor is $K_2SiF_6:Mn^{4+}$.

10. The device according to claim 8, wherein an average particle diameter of the first phosphor is in a range of 20 to 50 μm.

11. The device according to claim 8, wherein the first phosphor has a peak emission wavelength in a range of 610 to 650 nm.

12. The device according to claim 8, wherein a full width at half maximum of an emission peak of the first phosphor is 10 nm or less.

13. The device according to claim 1, wherein the sealing resin includes the second phosphor.

14. The device according to claim 13, wherein the second phosphor is $3.5MgO.0.5MgF_2.GeO_2:Mn^{4+}$.

15. The device according to claim 13, wherein an average particle diameter of the second phosphor is in a range of 20 to 50 μm.

16. The device according to claim 13, wherein the second phosphor has a peak emission wavelength of 650 nm or more.

17. The device according to claim 13, wherein a full width at half maximum of an emission peak of the second phosphor is in a range of 15 to 35 nm.

18. The device according to claim 1, wherein an average particle size of the sulfide phosphor is in a range of 5 to 20 μm.

19. The device according to claim 1, wherein the sulfide phosphor has a peak emission wavelength in a range of 520 to 560 nm.

20. The device according to claim 1, wherein a full width at half maximum of an emission peak of the sulfide phosphor is 55 nm or less.

* * * * *